United States Patent
Chen et al.

(10) Patent No.: US 6,837,980 B2
(45) Date of Patent: Jan. 4, 2005

(54) BOND ENHANCEMENT ANTITARNISH COATINGS

(75) Inventors: Szuchain F. Chen, Hamden, CT (US); Leonard R. Howell, Vernon, CT (US)

(73) Assignee: Olin Corporation, New Haven, CT (US)

(*) Notice: Subject to any disclaimer, the term of this patent is extended or adjusted under 35 U.S.C. 154(b) by 384 days.

(21) Appl. No.: 10/017,863

(22) Filed: Dec. 12, 2001

(65) Prior Publication Data

US 2002/0112965 A1 Aug. 22, 2002

Related U.S. Application Data

(60) Provisional application No. 60/307,722, filed on Jul. 25, 2001, and provisional application No. 60/257,712, filed on Dec. 21, 2000.

(51) Int. Cl.$^7$ ............... C25D 3/56; B32B 15/00; C09D 1/00
(52) U.S. Cl. ............ 205/243; 205/244; 205/704; 427/436; 427/437; 428/658; 428/666; 428/674; 428/687; 428/935; 428/936; 106/1.17; 106/1.22; 106/1.25; 106/1.29
(58) Field of Search ............... 205/243, 244, 205/704; 427/436, 437; 428/658, 666, 674, 687, 935, 936; 106/1.17, 1.22, 1.25, 1.29

(56) References Cited

U.S. PATENT DOCUMENTS

| 3,193,484 A | 7/1965 | Gleim ............... 204/79 |
| 3,666,637 A | 5/1972 | MacKay ............ 204/30 |
| 4,234,395 A | 11/1980 | Berdan et al. ........ 204/12 |
| 4,323,632 A | 4/1982 | Berdan et al. ....... 428/626 |
| 4,952,531 A | 8/1990 | Cherukuri ........... 501/69 |
| 5,022,968 A | 6/1991 | Lin et al. ............ 204/28 |
| 5,098,796 A * | 3/1992 | Lin et al. ............ 428/935 |
| 5,230,932 A | 7/1993 | Chen et al. .......... 428/607 |
| 5,250,363 A | 10/1993 | Chen ................ 428/607 |
| 5,449,951 A | 9/1995 | Parthasarathi et al. ... 257/677 |
| 5,573,845 A | 11/1996 | Parthasarathi et al. ... 428/306.6 |
| 5,658,869 A | 8/1997 | Singer .............. 510/272 |

FOREIGN PATENT DOCUMENTS

| JP | 55-44536 | 3/1980 | ........... C21D/9/48 |
| JP | 55-044536 A * | 3/1980 | ........... C21D/9/48 |

OTHER PUBLICATIONS

"Metallization Contamination," Microelectronic Defects Database, CALCE Electronic Products and Systems Center, University of Maryland, Apr. 12, 2000.
Barnes and Robinson, "The Impact of Ionic Impurities in Die Attach Adhesives on Device Performance", Proc. Of 34$^{th}$ Electronics Components Conf., May, 1984, p. 68.
Lee, C., et al., "An Analytical Characterization and Reliability Testing of an Adhesion Enhancing Zn–Cr Leadframe Coating for Popcorn Prevention", Conference Preprint, 1998, 9 pages, (no month given).
International Search Report for PCT/US01/50660, filing date Dec. 20, 2001.

* cited by examiner

Primary Examiner—Robert R. Koehler
(74) Attorney, Agent, or Firm—Wiggin and Dana LLP; Gregory S. Rosenblatt; Anthony P. Gangemi

(57) ABSTRACT

Aqueous electroplating solutions and methods are provided for the codeposition of zinc and chromium. The solutions include effective amounts of zinc, chromium, and hydroxyl ions. The solutions further include an effective amount of one or more ions of alkali metals, alkaline earth metals, or a combination thereof other than sodium and potassium, to in major part balance the hydroxyl ions. A preferred alkali metal is rubidium.

16 Claims, 1 Drawing Sheet

BOND ENHANCEMENT ANTITARNISH COATINGS

CROSS-REFERENCE TO RELATED APPLICATIONS

Priority is claimed to U.S. Provisional Patent Applications Ser. Nos. 60/257,712 and 60/307,722, both entitled "Bond Enhancement Antitarnish Coatings", respectively filed Dec. 21, 2000 and Jul. 25, 2001, the disclosures of which are incorporated by reference herein.

BACKGROUND OF THE INVENTION (1) Field of the Invention

This invention relates to the surface treatment of copper and its alloys, and more particularly to coatings providing tarnish resistance and/or improved package adhesion for integrated circuit lead frames.

(2) Description of the Related Art

U.S. Pat. No. 5,449,951 of Parthasarathi and Mahulikar (the '951 patent) discloses the use of a chromium-zinc coating on the lead frame of an integrated circuit (IC) package. The disclosure of the '951 patent is incorporated herein by reference as if set forth at length. The coating of the '951 patent, when applied to a copper lead frame, improves the adhesion between the lead frame and the polymeric material of the IC package. The '951 patent teaches electrolytic application of the coating from a solution comprising excess hydroxyl ions (OH), hexavalent chromium ions (Cr(VI)) and zinc ions. The '951 patent references the electrolytic deposition of U.S. Pat. No. 5,022,968 of Lin and Chao (the '968 patent). The '968 patent discloses use of sodium hydroxide or potassium hydroxide as the hydroxyl ion source.

The '951 patent identifies plating the lead frame prior to attachment of the semiconductor die to the lead frame die pad (a.k.a., die attach pad or paddle). After attachment, bond pads on the die are wire bonded to associated leads of the lead frame. To facilitate such wire bonding, the associated inboard areas of the leads are masked prior to being coated. Prior to the wire bonding, the mask is removed, permitting direct contact between each bond wire and the associated lead. Alternatively, the coating can be applied over the entire lead and, thereafter, etched or otherwise removed at the wire bonding location.

Contamination from ionic species is believed associated with die failure. See "Metallization Contamination," Microelectronic Defects Database, CALCE Electronic Products and Systems Center, University of Maryland, Apr. 12, 2000 (identifying chloride and sodium contamination from molding compounds, die coatings, and die attach coatings) and Barnes and Robinson, "The Impact of Ionic Impurities in Die Attach Adhesives on Device Performance", Proc. of 34th Electronics Components Conf, May, 1984, p.68 (identifying die attach adhesives as a particular source of ionic contamination).

BRIEF SUMMARY OF THE INVENTION

With the aim of minimizing this form of contamination in electronic packaging applications, we have developed an improved treatment process which employs plating solutions with substantially reduced amounts or free of sodium ions. This minimizes or eliminates residual sodium ions, which could cause potential failures in electronic packaging applications.

In one aspect of the invention, aqueous electroplating solutions and methods are provided for the codeposition of zinc and chromium. The solutions include effective amounts of zinc, chromium, and hydroxyl ions. The solutions further include an effective amount of one or more ions of alkali metals, alkaline earth metals, or a combination thereof, other than sodium and potassium, to in major part valence balance the hydroxyl ions. The preferred alkali metal is rubidium.

In various implementations of the inventive solutions and methods, the molar amount of rubidium ions should preferably be in excess of combined amounts of sodium and potassium ions in the solution or in excess of combined amounts of all other alkali metal ions in the solution. The chromium from the chromium ions may be present in major part as Cr(VI) ions. The solutions preferably may have a pH advantageously of at least 11.0 and at most 13.0. The solutions preferably consist essentially of 5–1300 g/l RbOH, 0.1–125 g/l ZnO, and 0.1–50 g/l $Na_2Cr_2O_7.2H_2O$, more preferably of 10–500 g/l RbOH, 0.25–50 g/l ZnO, and 0.2–20 g/l $Na_2Cr_2O_7.2H_2O$, and most preferably of 20–150 g/l RbOH, 0.5–10 g/l ZnO, and 0.4–5 g/l $Na_2Cr_2O_7.2H_2O$.

The coating preferably is applied via electrolytic or electroplating techniques. Advantageously, a current is applied to the item or member to be coated, such as, for example, a substrate or a lead frame. The plating is effective to plate exposed portions of the item with a coating consisting in major weight part of a combination of zinc and chromium. Preferably the zinc and chromium are codeposited with a flake-like morphology.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
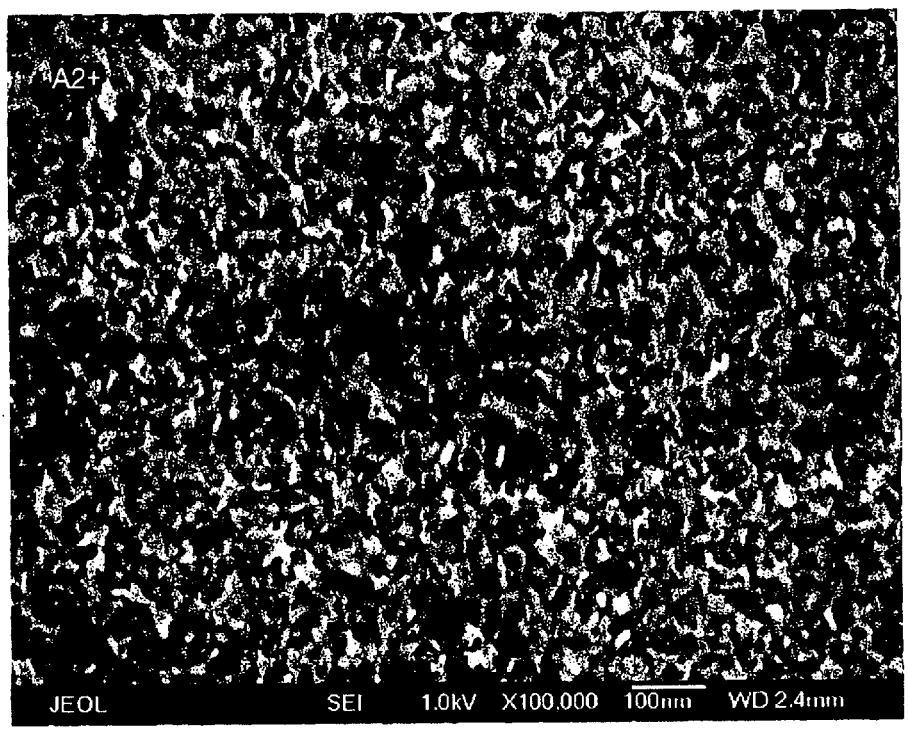
FIG. 1 is a scanning electron microscope (SEM) image of a first coating according to principles of the invention.

The potentially contaminating sodium ions generally originate in the hydroxyl salts and in the associated dichromate compounds. It has been found that substitution of one or more ions, such as other alkali metal or alkaline earth metal ions, can provide excellent plating performance while minimizing contamination by sodium ions of the electronic packaging environment.

Potential advantageous hydroxyl salts include those based on the alkali metals, Rb, Li and Cs, and alkaline earth metals Sr and Ba. The solubility of these salts and their dichromate/chromate compounds are shown in Table I:

TABLE I

| Cation | Hydroxyl Compounds | Dichromate/Chromate Compounds | Solubility (g/l) at Specified Temperatures |
|---|---|---|---|
| $Na^+$ sodium | NaOH | | 420 (20° C.), 3470 (100° C.) |
| | | $Na_2Cr_2O_7.2H_2O$ | 1800 (20° C.), 4330 (98° C.) |
| $K^+$ potassium | KOH | | 1070 (15° C.), 1780 (100° C.) |
| | | $K_2Cr_2O_7$ | 49 (0° C.), 1020 (100° C.) |
| $Li^+$ lithium | LiOH | | 128 (20° C.) |
| | | $Li_2Cr_2O_7.2H_2O$ | 1870 (30° C.) |

TABLE I-continued

| Cation | Hydroxyl Compounds | Dichromate/ Chromate Compounds | Solubility (g/l) at Specified Temperatures |
|---|---|---|---|
| $Rb^+$ rubidium | RbOH | | 1800 (15° C.) |
| | | $Rb_2Cr_2O_7$ | 50 (15° C.) |
| $Cs^+$ cesium | CsOH | | 3955 (15° C.) |
| | | $Cs_2Cr_2O_4$ | 714 (13° C.) |
| $Ba^{+2}$ barium | $Ba(OH)_2$ | | 56 (15° C.) |
| | | $BaCr_2O_7$ | Slightly soluble (cold) |
| $Sr^{+2}$ strontium | $Sr(OH)_2$ | | 4.1 (0° C.), 218 (100° C.) |
| | | $SrCrO_4$ | 1.2 (15° C.) |

To exemplify the invention, a copper alloy C110 (>99.90% Cu, <0.05% O nominal by weight) foil produced by electrodeposition was initially electrocleaned in a commercial alkaline cleaner to remove residual lubricant, contaminants, oxides, and the like from its surfaces. A sample foil (Sample 1) was then plated in an electrolyte plating solution containing 27.2 g/l RbOH, 1.77 g/l ZnO and 1.48 g/l $Na_2Cr_2O_7 \cdot 2H_2O$ with a pH of 12.64. Such a solution can be obtained by initially dissolving a high concentration of the alkali metal hydroxide in water. This initial concentration then permits the dissolving of zinc oxide (the hydroxide concentration being effective to complex the zinc to form zincate ions $(Zn(OH)_4^{-2})$). A second solution of the alkali metal hydroxide may then be used to dilute the first solution to reduce its zinc concentration to a desired amount along with reducing the hydroxide concentration to a desired amount. If not already added, the chromate or dichromate compound may be added at this point. It is most convenient to identify the composition of the plating solution by the equivalent concentration of its ingredients notwithstanding that, in solution, the ingredients may be dissolved and their components partially or largely recombined.

For plating a second such sample foil (Sample 2), the sodium dichromate was replaced by chromic acid ($CrO_3$) to completely eliminate the possibility of sodium contamination. The solution contained 28.1 g/l RbOH, 1.34 g/l ZnO, and 1.27 g/l chromic acid with a pH of 12.93. For comparison a third such sample foil (Sample 3) was plated in an electrolytic plating solution containing 12 g/l NaOH, 1.0 g/l ZnO, and 1.4 g/l $Na_2Cr_2O_7 \cdot 2H_2O$ with a pH of 13.40. A fourth such sample foil (Sample 4) was also using LiOH to replace NaOH in a plating solution containing 15.4 g/l LiOH, 1.7 g/l ZnO, and 1.57 g/l $Na_2Cr_2O_7 \cdot 2H_2O$.

Figure 2:
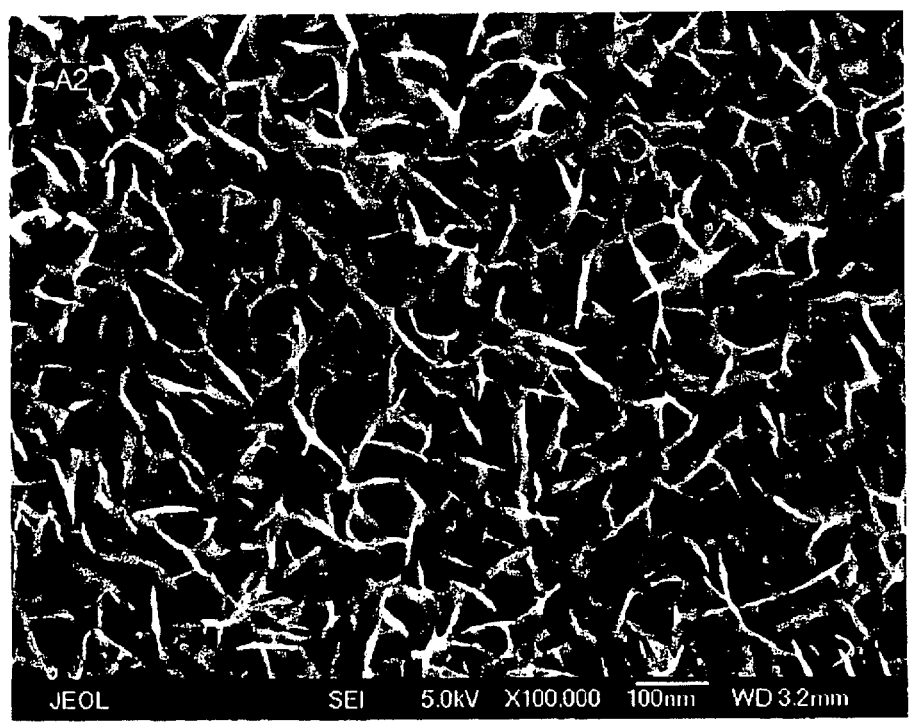
FIG. 2 is an SEM image of a prior art coating.

The pre-cleaning and electroplating conditions for Samples 2–4 were as described above. Plating was performed with all solutions using a DC plating current of 1.7A through a plated area of 51.6 cm² (multiplied by two sides) for a duration of twelve seconds. The samples were then rinsed and dried. FIG. 1 shows the surface morphology of the resultant coating of Sample 1 obtained with the rubidium-hydroxide based solution. Surprisingly, the surface has a much smaller and flake-like structure in distinction to the acicular structure of the Sample 3 obtained using the sodium hydroxide-based solution (FIG. 2).

The tarnish resistance of the coating of Samples 1, 2 and 4 was determined in a 250° C. by 10 minute bake test in laboratory air. Observed tarnish resistance was similar to that obtained with Sample 3. The adhesion properties of the coatings on Samples 1–4 were evaluated using a tape test. An adhesive tape is applied and rapidly removed from the coated specimen. To the extent the adhesive separates from the film carrier and remains on the specimen, an advantageous adhesion is indicated. A preferred tape for such a test is Scotch 600-brand office tape by 3M, St. Paul, Minn. In tests, all the foil Samples 1–4 retained the adhesive. It is noteworthy that such performance was achieved despite the differing morphology of the coating on Sample 1, compared with that of Sample 3.

In a second adhesion test of samples treated in the manner of Samples 1 and 3, one end of each of a pair of 0.006 inch thick copper alloy C7025 (96.2% Cu, 3.0% Ni, 0.65% Si, 0.15% Mg nominal by weight) strips was encapsulated in a block of molding compound to provide a test sample. Samples were exposed to steam at 15 psi for 96 hours and, after cooling, dipped in a 250° C. solder bath (60Sn-40Pb) for 10 seconds for thermal shock. After cooling, tension was then applied to the strips. Untreated strips pulled out of the molding compound at a shear of 375 psi along the interface between the strip and the compound. For treated strips plated with the sodium hydroxide-containing solution (Sample 3) or the rubidium hydroxide-containing solution (Sample 1), the strips themselves ruptured, indicating a shear force in excess of 1460 psi. When a thicker strip (0.015 inch thick C194, 97.5% Cu, 2.35% Fe, 0.03% P, and 0.12% Zn) was used with a treatment using a sodium-free RbOH solution (as described for Sample 2), an even higher shear strength, 1884 psi, was obtained after the same humidity chamber and soldering temperature excursion described above.

It is believed that acceptable results can be obtained if multiple alkali metals are used. There may be economic advantages in such combinations. For example, one such metal may initially be associated with the hydroxyl compound while another initially associated with the dichromate/chromate compound. Further, different alkali metals may be associated with one or both of those two components. It is also possible that, especially in lower concentrations, an alternative cation other than an alkali metal could be present. Listed below are a number of examples of possible plating solutions and parameters. All are believed suitable for plating on copper alloy specimens after such specimens have been electrocleaned (preferably in a sodium-free solution to avoid sodium residues and possible associated contamination). An exemplary electroplating current is a cathodic current of 5–100 amperes per square foot (asf) based on total area (e.g., both surfaces of a foil strip) applied at a temperature of 30–80° C. Preferably, a plating current density of 10–50 amperes per square foot and a solution temperature of 45–60° C. can be maintained. The examples include various alternative sodium-free chromate sources to minimize possibilities of sodium contamination. We expect results similar to that described for Sample 2 could be obtained.

TABLE II

| Hydroxide Source | Zinc Source | Chromium Source | Plating Current Density and Time |
|---|---|---|---|
| 25 g/l RbOH | 1.25 g/l ZnO | 0.96 g/l $CrO_3$ | 10 asf · 10 sec |
| 30 g/l RbOH | 1.25 g/l ZnO | 1.13 g/l $Rb_2Cr_2O_7$ | 10 asf · 10 sec |
| 44 g/l CsOH | 1.25 g/l ZnO | 0.82 g/l $Cs_2Cr_2O_7$ | 10 asf · 10 sec |
| 10 g/l RbOH | 0.25 g/l ZnO | 0.2 g/l $Rb_2Cr_2O_7$ | 5 asf · 20 sec |
| 300 g/l RbOH | 15 g/l ZnO | 13 g/l $Rb_2Cr_2O_7$ | 100 asf · 5 sec |

It is expected that the baths and plating conditions set forth in Table II would provide improved surface treatment results similar to those set forth for the other examples. The process of this invention can be applied to any desired material or part (such as for example, a lead frame or other desired element of an electronic package) for which improved adhesion to polymers is desired.

In the prior art, a Si-containing compound, for example; sodium metasilicate, is typically added to prolong the shelf life of the plating solution. The typical plating solution without the Si addition could have Zn hydroxide precipitates in about 0.5–2 hours at the operating temperature. With the addition of Si, the shelf life of the plating solution is prolonged to a few days. The solution can then be filtered and adjusted to the specified compositions and reused.

In the foregoing tests, to demonstrate a Na-free or low-Na plating solution in principle, sodium metasilicate was still added to the plating bath to prolong the shelf life. We believed that a small amount of Na (in the parts per million (ppm) range) in the Si source would not affect the performance of the plating solution. A Na-free Si source has been identified as ammonium hexafluorosilicate and examples are given below. Such a source may be used if it is desired to have a more completely sodium-free solution.

A solution containing 37 g/l RbOH, 2.0 g/l Zn as zinc oxide, 0.5 g/l Cr as chromic acid, and 82 ppm Si as ammonium hexafluorosilicate (1.37 g/l) was plated at 56° C. using a current density of 10 mA/cm$^2$ for 10 sec. Tape adhesion test results showed 100% transfer of the adhesive of the tape to the plated metal surface. The same solution was adjusted to 2.35 g/l Zn and 40.6 g/l RbOH with other conditions unchanged and produced 100% tape adhesion results. The same solution was further adjusted to 3.14 g/l Zn and 52.4 g/l RbOH and produced 100% tape adhesion results. At this point the Si concentration was analyzed to be 75.8 ppm (a range of 20–150 ppm is believed advantageous). This solution was stable for about 4 days before precipitates were observed. Thus, it appears to be demonstrated that what Si is responsible for prolonging the shelf life of the plating bath. Other chemicals that contain Si could serve this purpose. Examples could be alkaline or alkali earth metal (preferably other than Na and K) silicate compounds.

One or more embodiments of the present invention have been described. Nevertheless, it will be understood that various modifications may be made without departing from the spirit and scope of the invention. For example, a variety of lead frame materials may be utilized and the electrical and chemical parameters of the plating process may be optimized for particular applications or needs. Accordingly, other embodiments are within the scope of the following claims.

What is claimed is:

1. A method for applying a coating to a copper or copper alloy item, the coating consisting in major part of a combination of zinc and chromium, characterized by exposing the item to an aqueous solution comprising effective amounts of hydroxyl ions (OH$^-$), Zn-containing ions, and Cr-containing ions and of rubidium ions (Rb$^+$) in major part valence balancing the OH$^-$.

2. A method for applying a coating to an item, the coating consisting in major part of a combination of zinc and chromium, characterized by exposing the item to an aqueous solution comprising effective amounts of hydroxyl ions (OH$^-$). Zn-containing ions, and Cr-containing ions and of rubidium ions (Rb$^+$) in major part valence balancing the OH$^-$, wherein the amount of Rb$^+$ is in excess of combined amounts of Na$^+$ and K$^+$ in the solution; and the Cr-containing ions are present in major part as Cr(VI) ions.

3. The method of claim 2 wherein:
the amount of Rb is in excess of combined amounts of other alkali metals in the solution.

4. The method of claim 2 wherein the solution has a pH of at most 13.0.

5. The method of claim 4 wherein the solution has a pH of between 11.0 and 13.0.

6. A method for coating an item characterized by:
exposing the item to an aqueous solution comprising effective amounts of:
hydroxyl ions (OH$^-$);
one or more ions of alkali metals, alkaline earth metals, or a combination thereof other than Na, to in major part valence balance the OH$^-$;
Zn-containing ions; and
Cr-containing ions; and applying a current through the item effective to plate exposed portions of the item with a coating consisting in major part of a combination of Zn and Cr codeposited with a flake-like morphology.

7. A coated item manufactured by the method of claim 6.

8. A method for treating a metallic surface comprising:
exposing the surface to an aqueous solution comprising effective amounts of Rb$^+$, hydroxyl ions (OH$^-$), Zn-containing ions and Cr-containing ions;
running a current through the surface so as to plate the surface with a coating consisting in major part of a combination of zinc and chromium.

9. The method of claim 8 wherein:
a step of providing the solution comprises introducing the Rb$^+$ in the solution as RbOH;
the amount of Rb$^+$ is in excess of combined amounts of Na$^+$ and K$^+$ in the solution; and
the Cr in the Cr$^-$-Containing ions is present in major part as Cr(VI) ions.

10. An aqueous electroplating solution for the codeposition of zinc and chromium comprising effective amounts of:
hydroxyl ions (OH$^-$);
one or more ions of alkali metals, alkaline earth metals, or a combination thereof other than Na and K, to in major part valence balance the OH$^-$;
Zn-containing ions; and
Cr-containing ions.

11. The solution of claim 10 consisting essentially of a solution of:
5–1300 g/l RbOH;
0.1–125 g/l ZnO; and
0.1–50 g/l Na$_2$Cr$_2$O$_7$.2H$_2$O.

12. The solution of claim 11 further comprising an amount of ammonium hexafluorosilicate effective to stabilize the solution so as to substantially prevent zinc hydroxide precipitation over a period of about 4 days.

13. The method of claim 1, wherein the amount of Rb$^+$ is in excess of combined amounts of Na$^+$ and K$^+$ in the solution; and the Cr-containing ions are present in major part as Cr(VI) ions.

14. The method of claim 1 wherein:
the amount of Rb is in excess of combined amounts of other alkali metals in the solution.

15. The method of claim 1 wherein the solution has a pH of at most 13.0.

16. The method of claim 15 wherein the solution has a pH of between 11.0 and 13.0.

* * * * *